United States Patent [19]
Simon

[11] Patent Number: 5,208,942
[45] Date of Patent: May 11, 1993

[54] INSERTION AND REMOVAL AID

[75] Inventor: Peter Simon, Munich, Fed. Rep. of Germany

[73] Assignee: Knürr-Mechanik für die Elektronik Aktiengesellschaft, Munich, Fed. Rep. of Germany

[21] Appl. No.: 748,649

[22] Filed: Aug. 23, 1991

[30] Foreign Application Priority Data

Aug. 23, 1990 [DE] Fed. Rep. of Germany ... 9012143[U]

[51] Int. Cl.⁵ .................. A47B 95/02; H01R 13/62
[52] U.S. Cl. ............................... 16/115; 16/112; 439/157
[58] Field of Search .............. 16/115, 112; 439/152, 439/153, 157

[56] References Cited

U.S. PATENT DOCUMENTS

| | | | |
|---|---|---|---|
| 686,280 | 11/1901 | Gaudin | 16/115 |
| 4,440,431 | 4/1984 | Collurafici et al. | 16/115 |
| 4,440,517 | 4/1984 | Potter et al. | 16/115 |
| 4,530,615 | 7/1985 | Katsurra et al. | 16/112 |
| 4,638,405 | 1/1987 | Smith | 16/112 |
| 4,875,867 | 10/1989 | Hoo | |

FOREIGN PATENT DOCUMENTS

| | | |
|---|---|---|
| 0272521 | 12/1987 | European Pat. Off. . |
| 0293215 | 5/1988 | European Pat. Off. . |
| 0369025 | 4/1989 | European Pat. Off. . |
| 0357308 | 8/1989 | European Pat. Off. . |
| 3711341A1 | 10/1988 | Fed. Rep. of Germany . |

Primary Examiner—Lowell A. Larson
Assistant Examiner—Carmine Cuda
Attorney, Agent, or Firm—Keck, Mahin & Cate

[57] ABSTRACT

The invention relates to an insertion and removal aid, particularly for the fitting of electronic subassemblies in systems, with a moulding, which has a locking part and a gripping part, the gripping part being provided with an extension and a substantially complimentary recess for receiving the extension.

15 Claims, 1 Drawing Sheet

INSERTION AND REMOVAL AID

BACKGROUND OF THE INVENTION

The invention relates to an insertion and removal aid, particularly for the fitting of electronic subassemblies in systems, having a moulding, which is provided with a locking and a gripping part.

Besides the front panel and the holder, insertion and removal aids are parts of the front system of mounting systems, which are used for receiving subassemblies and which are employed in data, measuring, medical, communications, control and regulating technology and in other fields.

Insertion and removal aids of the type according to the preamble are known in the art. These plastic insertion and removal aids have a locking part for the positive locking of the subassemblies to the connecting rails of the subassembly carrier, as well as a gripping part and during the assembly and disassembly of the connector the insertion and removal forces are applied thereto and are transmitted by lever action.

In practice, it has been found that the insertion and removal of subassemblies with an insertion and removal aid constructed in this way is relatively difficult and complicated. Particularly in the case of subassemblies having a high PIN density, the existing application surface of the gripping part is often not sufficient to overcome the high insertion and removal forces which occur.

SUMMARY OF THE INVENTION

The object of the invention is to so construct an insertion and removal aid that, even in the case of a high PIN density, a precise and reliable insertion and removal of the corresponding subassembly is possible in the case of a constructionally simple and non-hindering construction.

This object is achieved by the characterizing features of claim 1. As a result of the fact that the gripping part is provided with an extension which can be slid in and out and which in the slid-in state rests in a complimentary recess of the gripping part, the application surface can always be extended if this is necessary. In the slid-in state, i.e. following the insertion or removal process, the extension is almost completely and positively engaged in the gripping part, which gives a free viewing field, e.g. of diodes or other indicating elements.

The basic idea of the invention is to increase the application surface by means of an extension in the gripping part which can be slid in and out, so that the lever action is reinforced and the insertion and removal of the subassemblies can take place more easily and reliably, as well as with a reduced force expenditure on the part of the operator. Simultaneously as a result of the construction of the extension a positive, stable connection is obtained.

Preferably the extension according to the invention extends over the entire width of the gripping part. However, a rod-like construction is also possible. The recess in the gripping part for receiving the extension is then correspondingly shaped, so that a reliable, stable guidance of the extension is ensured.

For improved handling purposes, it is appropriate to offset the end of the extension and round it in such a way that it is inserted in the recess of the gripping part when slid in following the assembly and disassembly of subassemblies.

According to an advantageous development of the invention the upper end of the extension is cylindrical and in the slid-in state is located in a roughly semicircular depression of the gripping part. A free viewing field of the indicating elements or inscriptions is maintained. It is also appropriate to secure the extension by a locking region or by means of locking elements in both end positions.

It is also possible to form the locking region on the outer circumference of the extension by means of punctiform or circular projections, which can engage in complimentary depressions in the guide for the gripping part. Appropriately, at least in the locking region, the extension is hollow, so as to obtain the necessary elasticity or tension.

Other constructions of the locking region or locking elements fall within the scope of the invention. For example, the projections can be located in the lower and upper areas of the recess, whilst analogously thereto the extension is provided in the upper and lower areas with correspondingly shaped holes, into which can engage the resiliently mounted projections.

Although the insertion and removal aid, together with the extension are preferably made from a metallic material or pressure die casting, it is also possible to use rigid plastics materials.

Alternatively the extension can be positively guided in the outer region, e.g. in lateral grooves, but there is always an alignment with the lateral faces of the insertion and removal aid.

The invention is described in greater detail hereinafter relative to an embodiment.

DESCRIPTION OF THE PREFERRED EMBODIMENTS

Figure 1:
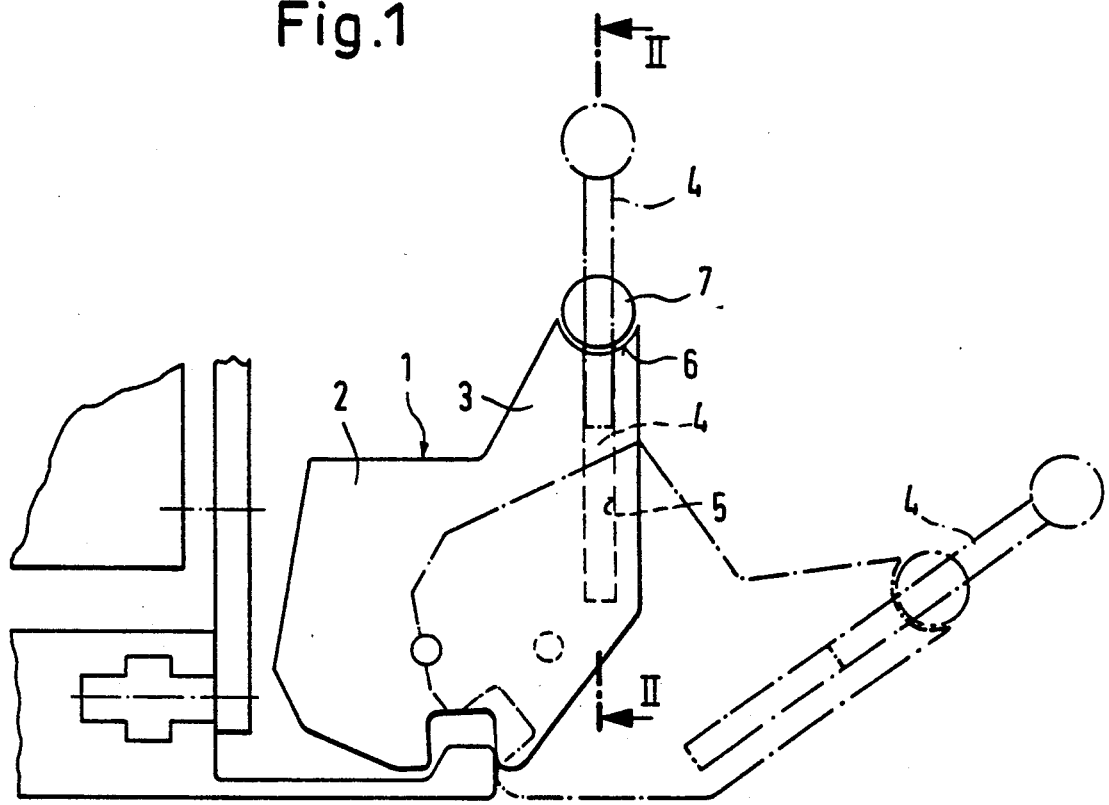
FIG. 1 is a side view of the insertion and removal aid according to the invention.
Figure 2:
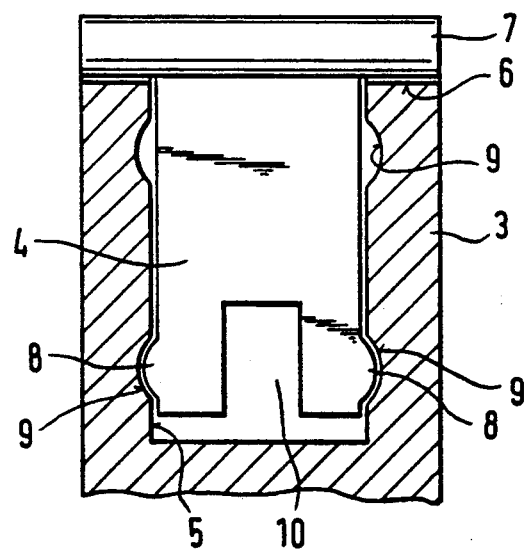
FIG. 2 is a section along line II—II in FIG. 1.

The diagrammatically represented insertion and removal aid essentially comprises a metal molding 1, which is constituted by a locking part 2, to which no further reference is made here, and a gripping part 3. The inventive extension 4 is, in the slid-in state, positively engaged in a recess 5 having a complimentary construction in the gripping part 3 and which therefore guides the extension. The extension 4, which can be slid in and out, extends over virtually the entire width of the gripping part 3 (FIG. 2). The upper end is offset and cylindrical. The complimentary, upper area of the gripping part has a semicircular depression 6, in which positively rests in the slid-in state the cylindrical handle 7 of the extension 4.

In the selected embodiment the locking elements in the lower area of the extension 4 are constituted by punctiform projections 8 and analogously thereto depressions 9 in the lower and upper area of the recess 5 of the gripping part 3, so that the extension 4, which also has a cavity for this purpose in the locking area, is reliably positioned in both the slid-in and slid-out state.

With the assistance of the represented insertion and removal aid, it is possible to easily and reliably insert and remove subassemblies even having a high PIN density with respect to systems, without it being necessary to exceed the given basic contour of said aid and consequently the free front surface of a corresponding subassembly is maintained.

What I claim is:

1. An insertion and removal aid, for the fitting of electronic subassemblies in systems, comprising:
   a molding having a locking part and a gripping part, wherein said gripping part comprises an extension which can slide in and out of said gripping part and is received in a recessed extension guide in said gripping part shaped for receiving said extension in its slid-in position,
   wherein an upper end of the extension has a cylindrical handle, which in the slid-in position is located in a substantially semicircular depression of the gripping part.

2. An insertion and removal aid according to claim 1, wherein the extension extends over substantially the entire width of the gripping part.

3. An insertion and removal aid according to claim 1, wherein the extension is rod-shaped.

4. An insertion and removal aid according to claim 1, wherein the upper end of the extension is offset.

5. An insertion and removal aid according to claim 1, wherein the upper end of the extension is rounded and shaped complementarily to a depression in the gripping part.

6. An insertion and removal aid according to claim 1, wherein the extension, is secured in the slid-in and slid-out positions by a locking region.

7. An insertion and removal aid according to claim 6, wherein the locking region has punctiform or circular locking elements on the outer circumference of the extension and the extension in said region has a cavity.

8. An insertion and removal aid according to claim 1, wherein the molding is constructed from a pressure die casting.

9. An insertion and removal aid according to claim 1, wherein the molding is made from plastic.

10. An insertion and removal and aid according to claim 1 wherein the extension is secured in the slid-in and slid-out positions by means of locking elements.

11. An insertion and removal aid according to claim 10, wherein the locking elements engage in complimentary depressions of the extension guide in both the slid-in and slid-out positions.

12. An insertion and removal aid according to claim 10, wherein the locking elements are located in upper and lower areas of the extension guide and the extension comprises engagement areas selected from depressions and holes.

13. An insertion and removal aid according to claim 10, wherein the locking elements have a spring bias.

14. An insertion and removal aid according to claim 1 wherein the extension is constructed from a pressure die casting.

15. An insertion and removal aid according to claim 1 wherein the extension is made from plastic.

* * * * *